United States Patent
Nasman et al.

(10) Patent No.: US 12,341,053 B2
(45) Date of Patent: Jun. 24, 2025

(54) SYSTEM FOR BACKSIDE DEPOSITION OF A SUBSTRATE

(71) Applicant: Tokyo Electron Limited, Tokyo (JP)

(72) Inventors: Ronald Nasman, Averill Park, NY (US); Gerrit J. Leusink, Rexford, NY (US); Rodney L. Robison, East Berne, NY (US); Hoyoung Kang, Guilderland, NY (US); Daniel Fulford, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 18/581,154

(22) Filed: Feb. 19, 2024

(65) Prior Publication Data

US 2024/0194516 A1  Jun. 13, 2024

Related U.S. Application Data

(63) Continuation of application No. 16/047,711, filed on Jul. 27, 2018, now Pat. No. 11,908,728.
(Continued)

(51) Int. Cl.
*H01L 21/687* (2006.01)
*C23C 16/44* (2006.01)
(Continued)

(52) U.S. Cl.
CPC .... *H01L 21/68735* (2013.01); *C23C 16/4409* (2013.01); *C23C 16/4412* (2013.01);
(Continued)

(58) Field of Classification Search
CPC ............... H01J 37/32091; H01J 37/321; H01J 37/32403; H01J 37/32449;
(Continued)

(56) References Cited

U.S. PATENT DOCUMENTS 5,188,058 A   2/1993  Nakai
5,679,405 A   10/1997 Thomas et al.
(Continued)

FOREIGN PATENT DOCUMENTS

JP   07-238380 A   9/1995
JP   10-189469 A   7/1998
(Continued)

OTHER PUBLICATIONS

International Search Report and Written Opinion issued Nov. 5, 2018 in International Patent Application No. PCT/US2018/044184, 20 pages.
(Continued)

*Primary Examiner* — Kurt Sweely
(74) *Attorney, Agent, or Firm* — Oblon, McClelland, Maier & Neustadt, L.L.P.

(57) ABSTRACT

An apparatus for depositing films on a backside of a substrate includes a processing chamber and a substrate support having an annular support surface. A first gas distribution unit includes a plurality of gas delivery openings arranged along the backside surface of the substrate and configured to direct plasma deposition gas to the backside surface. A second gas distribution unit is configured to flow a second gas into the processing chamber such that the front side surface of the substrate is exposed to the second gas. A controller is configured to control flow of the plasma deposition gas from the first gas distribution unit, flow of the second gas from the second gas distribution unit a vacuum system. The controller maintains a gas pressure differential between the front side surface and the backside surface of the substrate sufficient to prevent passage of the deposition gas from the backside surface.

20 Claims, 3 Drawing Sheets

Related U.S. Application Data

(60) Provisional application No. 62/538,251, filed on Jul. 28, 2017.

(51) Int. Cl.

| | | |
|---|---|---|
| *C23C 16/455* | (2006.01) | |
| *C23C 16/458* | (2006.01) | |
| *C23C 16/505* | (2006.01) | |
| *H01J 37/32* | (2006.01) | |
| *H01L 21/67* | (2006.01) | |

(52) U.S. Cl.
CPC ........ *C23C 16/455* (2013.01); *C23C 16/4585* (2013.01); *H01J 37/32449* (2013.01); *C23C 16/505* (2013.01); *H01L 21/67069* (2013.01)

(58) Field of Classification Search
CPC ........... H01J 37/32513; H01J 37/32715; H01J 37/32816; H01J 37/32834; C23C 16/452; C23C 16/45506; C23C 16/45508; C23C 16/45521; C23C 16/45565; C23C 16/45597; C23C 16/4583; C23C 16/4409; C23C 16/4412; C23C 16/455; C23C 16/4585; C23C 16/505; H01L 21/68735; H01L 21/68785; H01L 21/67069
See application file for complete search history.

(56) References Cited

U.S. PATENT DOCUMENTS

| | | | |
|---|---|---|---|
| 5,960,555 | A | 10/1999 | Deaton et al. |
| 6,013,136 | A | 1/2000 | Mathuni |
| 6,183,565 | B1 | 2/2001 | Granneman et al. |
| 7,371,436 | B2 | 5/2008 | Fukiage |
| 7,648,579 | B2 | 1/2010 | Goodman et al. |
| 7,967,912 | B2 | 6/2011 | Yajima |
| 7,967,996 | B2 | 6/2011 | Collins |
| 8,852,349 | B2 | 10/2014 | Chacin |
| 8,888,950 | B2 * | 11/2014 | Lee .................. H01L 21/68735 |
| | | | 156/345.43 |
| 9,881,788 | B2 | 1/2018 | Kim et al. |
| 2004/0166789 | A1 | 8/2004 | Ashjaee et al. |
| 2005/0221618 | A1 | 10/2005 | AmRhein et al. |
| 2006/0051938 | A1 | 3/2006 | Connell et al. |
| 2006/0060302 | A1 | 3/2006 | White |
| 2007/0218664 | A1 | 9/2007 | Ito |
| 2008/0230096 | A1 | 9/2008 | Kawamura |
| 2010/0059478 | A1 | 3/2010 | Lee et al. |
| 2010/0314725 | A1 | 12/2010 | Gu et al. |
| 2012/0038277 | A1 * | 2/2012 | Eto .................. H01J 37/32183 |
| | | | 315/111.21 |
| 2016/0196959 | A1 * | 7/2016 | Shojaei ............ H01J 37/32889 |
| | | | 118/723 E |

FOREIGN PATENT DOCUMENTS

| | | |
|---|---|---|
| JP | 10-189564 A | 7/1998 |
| JP | 2002-208590 A | 7/2002 |
| JP | 2002-521815 A | 7/2002 |
| JP | 2005-501395 A | 1/2005 |
| KR | 10-2008-0084323 A | 9/2008 |
| KR | 10-2015-0088238 A | 7/2015 |
| TW | 201712778 A | 4/2017 |
| WO | 2015/097871 A1 | 7/2015 |

OTHER PUBLICATIONS

Combined Chinese Office Action and Search Report issued Jul. 21, 2021 in corresponding Chinese Patent Application No. 201880049587.1 (with English translation), 22 pages.
Chinese Office Action dated Jul. 21, 2021 in Chinese Patent Application No. 201880049587.1 w/English translation, 22 pages.
Office Action issued Apr. 20, 2022, in corresponding Taiwanese Patent Application No. 107126288, filed Jul. 30, 2018, with English translation (10 pages).
Japanese Office Action issued on Jun. 28, 2022, in Patent Application No. 2020-504190 w/English translation thereof 14 pages.
Korean Office Action dated Jun. 20, 2023 in Korean Patent Application No. 10-2020-70041810 w/English translation, 21 pages.

* cited by examiner

SYSTEM FOR BACKSIDE DEPOSITION OF A SUBSTRATE

CROSS REFERENCE TO RELATED APPLICATIONS

The present application is a continuation of U.S. application Ser. No. 16/047,711, filed Jul. 27, 2018 (now U.S. Pat. No. 11,908,728), which claims the benefit of U.S. Provisional Patent Application No. 62/538,251, filed on Jul. 28, 2017, entitled "System and Method for Backside Deposition of a Substrate," which is incorporated herein by reference in its entirety.

BACKGROUND OF THE INVENTION

This disclosure relates to semiconductor fabrication, and particularly to wafer overlay.

Semiconductor fabrication involves multiple varied steps and processes. One typical process is known as photolithography (also called microlithography). Photolithography uses radiation, such as ultraviolet or visible light, to generate fine patterns in a semiconductor device design using photo-reactive films. Many types of semiconductor devices, such as diodes, transistors, and integrated circuits, can be fabricated using semiconductor fabrication techniques including photolithography, etching, film deposition, surface cleaning, metallization, and so forth.

Exposure systems (also called tools) are used to implement photolithographic techniques. An exposure system typically includes an illumination system, a reticle (also called a mask) or spatial light modulator (SLM) for creating a circuit pattern, a projection system, and a wafer alignment stage for aligning a semiconductor wafer that has been coated with a photosensitive resist. The illumination system illuminates a region of the reticle or SLM with a (preferably) rectangular slot illumination field. The projection system projects an image of the illuminated region of the reticle pattern onto the wafer. For accurate projection, it is important to expose a pattern of light on a wafer that is relatively flat or planar, preferably having less than 10 nanometers of height deviation.

SUMMARY

Semiconductor fabrication development now incorporates techniques such as advanced patterning and 3D device construction to reduce feature size and increase device density. The implementation of these techniques, however, has created new challenges for successful micro fabrication. These new fabrication approaches include the creation of multiple layers of film of various materials, on the wafer surface. Each layer, however, adds additional stress to the surface of the wafer. As the layers of film build up, the induced stress distorts the flatness of the wafer. This distortion has been shown to reduce the size uniformity of critical features across the surface of the wafer.

This distortion also results in overlay errors and challenges. Various fabrication process steps can cause expansion and/or contraction of the substrate, resulting is a warped or bowed substrate. For example, during exposure a substrate is heated locally due to the energy transferred to the substrate from an exposure beam. Substrates are also heated during anneal processes. This heating causes the substrate to expand. If the substrate expansion is unchecked, the expansion exceeds overlay error requirements. Moreover, if the clamping force between the substrate and the substrate chuck is insufficient to prevent substrate expansion, then the substrate can slip on the substrate chuck and larger substrate expansion will occur, resulting in larger overlay errors. Slipping can be more pronounced in some processes, such as in extreme ultraviolet (EUV) systems, because the environment surrounding the substrate during exposure is a vacuum. Thus, vacuum clamping is not always possible, and the weaker electrostatic clamping must be used in lieu of a vacuum clamp.

Other fabrication steps can also cause substrate expansion and contraction. For example, deposited films can cause substrate contraction. Also, various annealing and doping steps can create substantial amounts of bow in a given substrate. Annealing steps can especially create overlay challenges. The result of these various fabrication steps is a substrate that is uneven or non-planar. For example, a backside of the substrate can have z-height differences (differences in vertical heights) that have both high spots and low spots. Height differences due to such bowing can be on the order of about a micron to approximately 100 microns. This fluctuation is significant because semiconductor devices or structures being exposed by various exposure tools are being exposed on scales of tens of nanometers to hundreds of nanometers. Thus having deflection variations of thousands of nanometers to 10,000 nanometers can dramatically reduce yield.

Conventional techniques used to address substrate bow and uneven curvature on partially-processed substrates focus on chucking techniques to chuck (or clamp/suck) a substrate to a substrate holder to flatten curvature. With relatively significant bowing, however, it can be very difficult or impossible to accurately flatten a substrate by chucking alone. Thus, it is desirable to have a substrate bow correction technique to correct substrate bow and improve overlay prior to being sent or returned to a scanner for additional exposures.

Techniques disclosed herein include systems for depositing films on a backside of a substrate to create corrective or compensating stresses to counter stresses on a working surface of a substrate to flatten the substrate. In other words, applying films to the back side of the wafer can balance stressed surfaces on a front side of the wafer, thus reducing the flatness distortion.

Depositing films on the backside of a substrate is challenging. While many different semiconductor manufacturing tools deposit films on the front side (top side or working surface) of a substrate, backside deposition is not routinely performed. With front side deposition, a substrate usually sits on a chuck, susceptor or plate and may be clamped to that surface. Such chucking causes scratches and defects to the backside surface. The scratches and defects introduced to the backside of the substrate as a result are generally inconsequential since features and devices (transistors) are not present on the backside surface. To use existing deposition tools to deposit a film on the backside of a substrate, the substrate would have to be flipped upside down and placed on the supporting surface for processing. Chucking the substrate on the front side surface will cause scratches, introduce defects, and generally destroy features under fabrication. Accordingly, for successful device fabrication, the substrate cannot be placed on, clamped to, or contact a chuck with the front side surface. One solution it to apply a protective coating to the front side surface, but such a protective coating presents a new set of challenges including the application and complete removal of the protective layer without damaging the features and structures underneath.

Techniques herein provide for backside deposition of films on a substrate while maintaining an existing orientation of a substrate without contacting a device region of the front side surface, and without contacting an interior region of the backside surface. Techniques herein contact a given substrate at only an outer perimeter or periphery of the substrate backside surface, while permitting remaining portions of the backside surface to be processed. Techniques herein include a substrate holder that effectively seals an upper section of a processing chamber from a lower section of a processing chamber so that deposition gases in the lower section cannot be deposited on the front side surface of the substrate. Without physically contacting either side of the substrate, there is a challenge to properly heat the substrate for film deposition. Conventionally, substrate holders (chucks) typically provide temperature control required by the various processes. Techniques herein provide an alternate means of temperature control though the creation of a separate and distinct environment above the substrate which, through proper pressure and gas selection, can be combined with a moveable temperature control surface that effectively controls the substrate temperature.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of various embodiments of the invention and many of the attendant advantages thereof will become readily apparent with reference to the following detailed description considered in conjunction with the accompanying drawings. The drawings are not necessarily to scale, with emphasis instead being placed upon illustrating the features, principles and concepts.

DETAILED DESCRIPTION

Techniques herein include a process chamber for application of thin films to backside surfaces of semiconductor substrates for the elimination or reduction of substrate flatness distortion. In other words, systems herein help make a bowed wafer flat by depositing films on the backside surfaces of wafers. The process chamber herein includes a substrate support that provides an annular perimeter seal around the bottom and/or side of the substrate which allows the majority of the substrate backside to be exposed to a process environment. One of various means of clamping and sealing the substrate can be selected. When the substrate creates a seal, the chamber is essentially bifurcated into lower and upper chambers or sections which are separate and distinct in terms of process environment. The lower section of the processing chamber includes deposition hardware configured to apply and remove thin films. The deposition hardware can be any of various types including chemical vapor deposition (CVD), atomic layer deposition (ALD), super atomic layer deposition (SALD), plasma enhanced CVD (PECVD) and atomic layer etch (ALE). The lower section can also be configured to incorporate a remote plasma unit to enable or enhance processing. The remote plasma unit can be incorporated as a supply pipe or as a ring, or as other alternative deployable configuration. The upper section can remain a chemically inert environment, protecting the existing features on the top surface of the substrate.

The seal provided by the substrate system is beneficial in that no purging gas flow from the upper section is necessary. Such a purging gas flow can have undesirable results. With techniques herein, the upper section can become a separate environment from the lower section, as well as providing an effective means of temperature control for the substrate.

Figure 1:
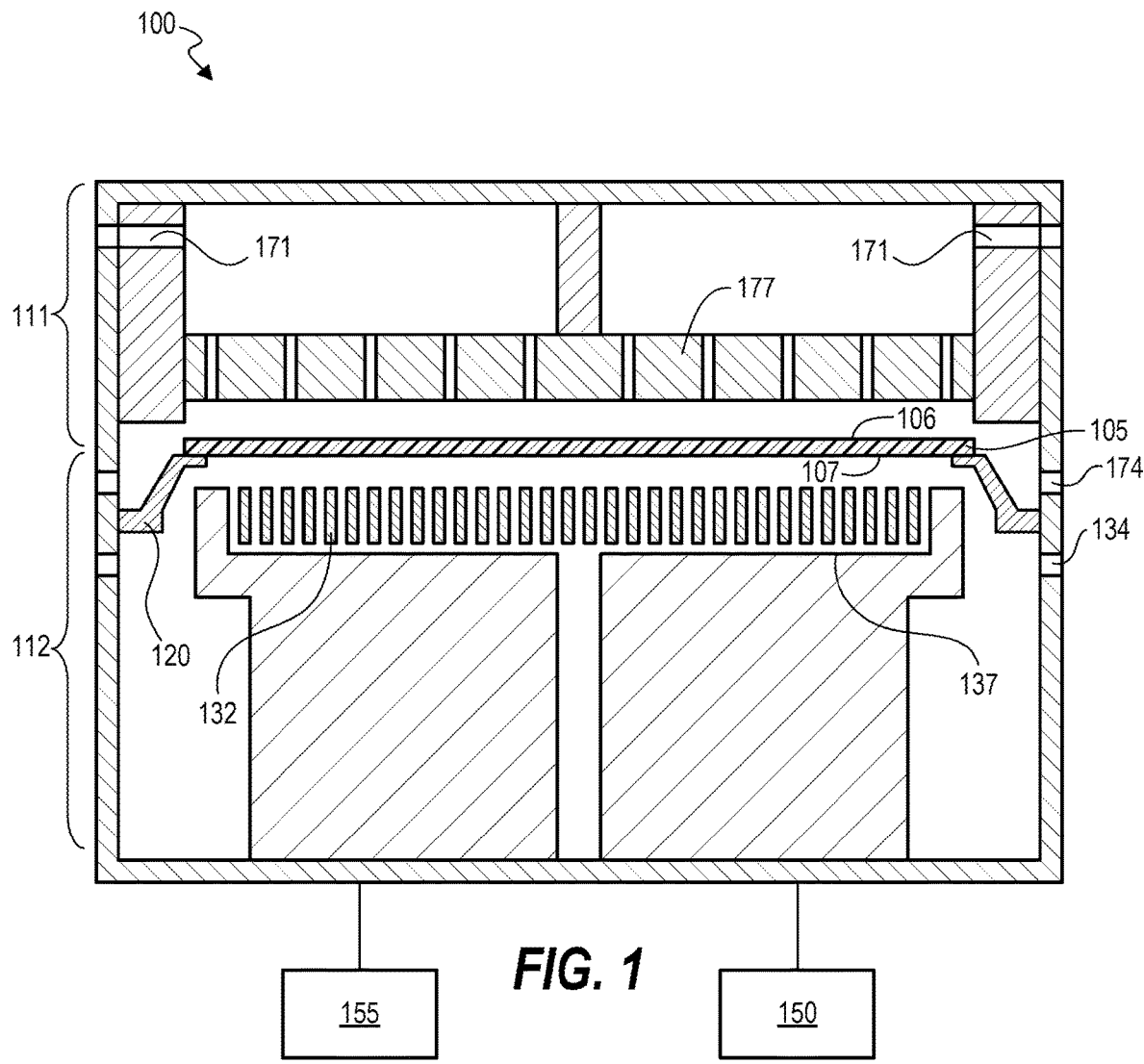
FIG. 1 is a cross-sectional view of an example backside deposition system.

Referring now to FIG. 1, one embodiment includes a backside deposition system 100 for depositing films on a backside of a substrate 105. The system includes a processing chamber that has an upper section 111 and a lower section 112. A substrate support mechanism 120 is positioned in the processing chamber and is configured to hold the substrate 105 between the upper section 111 and the lower section 112. The substrate 105 has a front side surface 106 for electrical devices and a backside surface 107 opposite the front side surface. For example, in semiconductor fabrication, a silicon wafer is used and transistors and other devices are typically formed on one side of the substrate. For most process, the substrate typically faces upward and the back surface is mounted or chucked to various substrate holders. The upper surface is then the working surface or front side surface on which semiconductor devices are micro-fabricated. The opposite side is labeled as the backside or backside surface.

The substrate support mechanism 120 herein, however, is configured to support the substrate 105 at a perimeter of the substrate without being in contact with interior regions of the front side surface 106 and without being in contact with interior regions of the backside surface 107. In other words, the substrate is handled or touched only at a periphery of the substrate. This can include an outer ring of the backside surface. Such substrates are typically circular, but can be rectangular or other shapes and have various dimensions. One common substrate size is a circular substrate of 300 mm diameter. By way of a non-limiting example, the substrate support mechanism (or elements of the substrate support mechanism) can be in contact with the backside surface and/or the front side surface in a region from an outside edge of the substrate and extending approximately a few millimeters to 12 millimeters or more towards a center of the substrate. Thus, a majority of the interior backside surface region (for example a region in this example with a diameter of approximately 260-298 mm is not in contact with the substrate support mechanism. Note that these are merely example dimensions. In general, a given substrate is only in contact with a support member at peripheral surfaces of the substrate.

The substrate support mechanism 120 is configured to hold the substrate with the front side surface 106 facing the upper section 111 and with the backside surface 107 facing the lower section 112. This can be beneficial for some processes because substrates do not need to be flipped from one system to another. The substrate support mechanism can be configured to create a seal at the perimeter of the substrate sufficient to prevent passage of deposition gas from the lower section to the upper section. For example, a fluid seal is formed around the substrate so that no (or very little) gas can flow past the seal and migrate between the upper section and the lower section. Such as seal can be formed using elastomeric materials and/or with pressure differential. Thus, the substrate support mechanism can be embodiments as a configuration of gas flows or pressure differential. With the substrate 105 accordingly held within the backside deposition system 100 and forming a seal at a periphery of the substrate, the substrate essentially divides the processing chamber between the upper section 111 and the lower section 112, and also functions to divide the processing chamber into two different environments. For example, the upper section 111 can have a processing pressure, temperature and gas chemistry different than the lower section. Note that the upper section and lower section are not necessarily equal in volume or size.

The system includes a gas distribution unit 132 positioned in the lower section of the processing chamber and facing the backside surface of the substrate when the substrate is being held by the substrate support mechanism. The gas distribution unit is configured to direct deposition gas to the backside surface 107 of the substrate for depositing a film on the backside surface of the substrate. A controller 150 is configured to control flow of deposition gas from the gas distribution unit 132 for deposition on the backside surface of the substrate. Accordingly, various different deposition processes can be executed such as chemical vapor deposition (CVD), atomic layer deposition (ALD), super atomic layer deposition (SALD), plasma enhanced CVD (PECVD) and atomic layer etch (ALE). Such films are deposited on the backside surface of the substrate without being deposited on the front side surface of the substrate. Such films can then be adjusted in the material composition and thickness to selectively provide tension or compressive stresses to counter wafer bowing to result in a flatter substrate.

The substrate support mechanism 120 can be embodied as a shelf for supporting a substrate at a perimeter location of the substrate. With the substrate support mechanism providing a sealing contact, substrate clamping can be achieved with differential pressures. For example, maintaining a relative greater pressure in the upper section as compared to a pressure maintained in the lower section causes the substrate to be forced against the substrate support mechanism or element of the support mechanism. This effectively seals the substrate at its edge. The support mechanism can move up or down to adjust substrate positioning within the processing chamber, and/or to help maintain a pressure differential. Precision control of the pressure differential is beneficial to have sufficient pressure to create a seal, yet insufficient pressure to excessively stress the substrate or cause the substrate to deflect too much or shatter.

Figure 6:
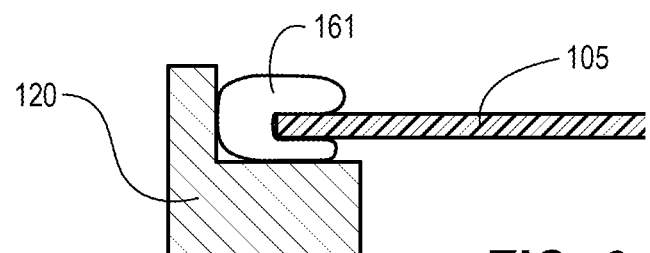
FIG. 6 is a cross-sectional view of an example substrate support seal mechanism.

The substrate support mechanism can include a deformable member configured to contact the perimeter of the substrate. Such a deformable member can help provide a gas seal at the substrate. Referring to FIG. 6, the deformable member includes an inflatable bladder 161 configured to surround a peripheral edge of the substrate such that when inflated the inflatable bladder holds the substrate and creates the seal, and when deflated the substrate can be removed from the processing chamber. In other words, an inflatable tube, for example, surrounds the substrate and presses the substrate edges towards a center point of the substrate. Such a bladder can move past the edge of the substrate such that a portion of the inflatable material contacts a portion of the front side surface as well as the backside surface.

Figure 3:
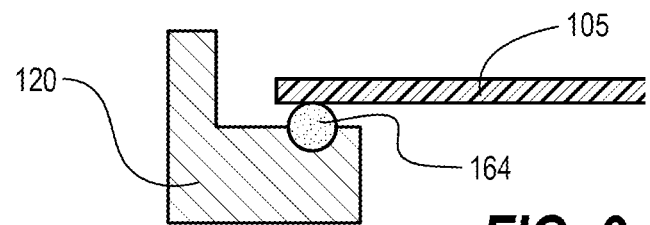
FIG. 3 is a cross-sectional view of an example substrate support seal mechanism.
Figure 4:
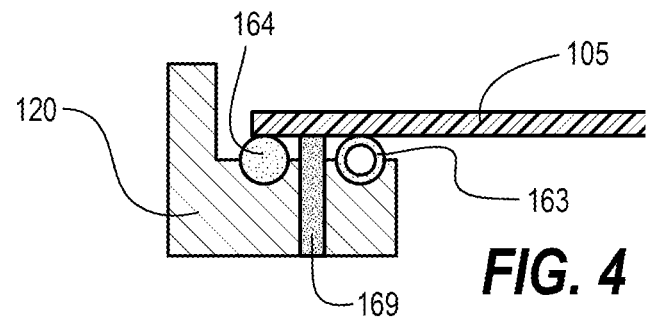
FIG. 4 is a cross-sectional view of an example substrate support seal mechanism.
Figure 5:
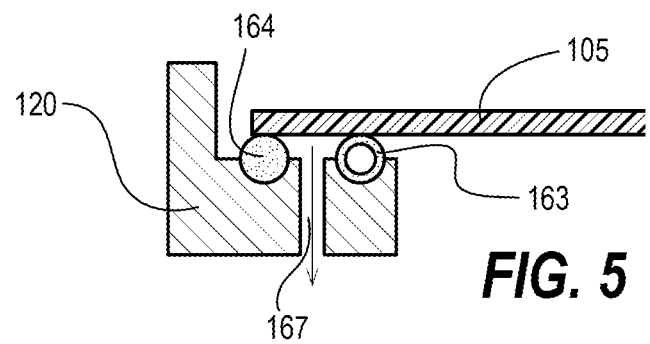
FIG. 5 is a cross-sectional view of an example substrate support seal mechanism.

Referring to FIGS. 3-5, in other embodiments, the deformable member includes an O-ring configured to contact the backside surface at a periphery of the backside substrate. This can include a first O-ring 163 and a second O-ring 164 both configured to contact the backside surface at a periphery of the substrate. The first O-ring 163 can have a smaller diameter as compared to the second O-ring such that there is a gap between the first O-ring 163 and the second O-ring 164. The substrate support mechanism can include a vacuum exhaust 167 positioned between the first O-ring 163 and the second O-ring 164. The substrate support mechanism 120 can include lift pins 169 positioned between the first O-ring 163 and the second O-ring 164 configured to raise and lower the substrate from the first O-ring and second O-ring. The first O-ring can have a smaller vertical height as compared to the second O-ring to better contour to substrate deflection, and/or the first O-ring can be more deformable as compared to the second O-ring.

Returning to FIG. 1, embodiments can include a gas delivery inlet 171 positioned in the upper section 111 of the processing chamber, which can include a shower head assembly or other gas distribution conduits to direct air flow from an inner region of the front side surface to a peripheral region of the substrate. The controller 150 can be configured to control gas flow from the gas delivery inlet 171 and from the gas distribution unit 132 to create a pressure differential between the upper section and the lower section when the substrate is being supported within the processing chamber. A first vacuum exhaust 174 can be connected to the upper section and a second vacuum exhaust 134 can be connected to the lower section. The controller 150 can be configured to control the first vacuum exhaust and the second vacuum exhaust to create a pressure differential between the upper section and the lower section when the substrate is being supported within the processing chamber.

Pressure gauges can be positioned to measure the pressure differential between the upper section and the lower section when the substrate is being supported within the processing chamber and to provide process feedback for adjustments to the pressure differential. The controller can be configured to control deflection of the substrate by controlling the first vacuum exhaust 174 and the second vacuum exhaust 134. The gas distribution unit can include a first heating mechanism 137 configured to controllably heat deposition gas. A second heating mechanism 177 can be positioned in the upper section of the processing chamber. The second heating mechanism 177 is configured to heat the substrate without contacting the front side surface of the substrate, such as by radiant heat and/or convective flow.

The substrate support mechanism can be configured to vertically translate the substrate within the processing chamber. In other words, to move the substrate up and down while being held and sealed. In other embodiments, the gas distribution unit is moveable towards the backside surface of the substrate and moveable away from the backside surface of the substrate. This movement can be beneficial depending on the type of film being deposited. In other embodiments, the second heating mechanism 177 is moveable towards the front side surface of the substrate and moveable away from the front side surface of the substrate. The system can include a remote plasma source 155 connected to the gas distribution unit configured to generate deposition gas. Note that a portion of a given gas distribution unit can be located outside of a processing chamber, but with a showerhead or other conduits positioned inside the processing chamber.

The heater above the substrate can be a heat lamp or other heat projection device such as a raster or scanning projection. The heater can also include a radiative plate or convective mechanism. Distance between the substrate and the heater can be minimized depending on a particular deposition reaction. Beneficial gas species such as helium can be used in the upper section to assist with heat transfer.

Figure 2:
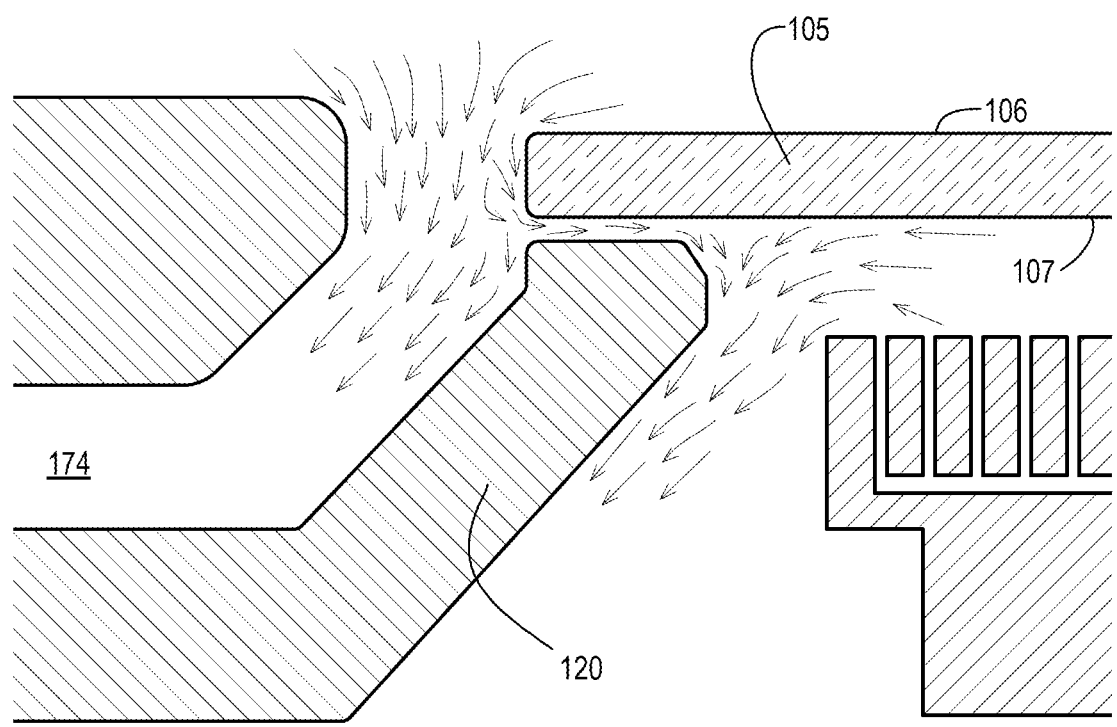
FIG. 2 is an enlarged cross-sectional view of a substrate support for preventing front side deposition.

In another embodiment, the system functions without a physical seal at the perimeter, or without a seal sufficient to physically obstruct air flow between a substrate holder and a substrate perimeter (when resting on the substrate holder). In this embodiment, a pressure differential or air flow differential is created so that deposition gas used for depositing a film on the backside surface flows to the backside surface of the substrate and then flows to an exhaust but does not flow to a front side surface of the substrate because of perimeter gas pressure. FIG. 2 illustrates this embodiment. A cross-section of a substrate support mechanism 120 is shown. In this embodiment, the substrate support mechanism is a rigid, annular, support, which has a flat, support surface that contacts the substrate. An edge of substrate 105 is shown resting on a substrate holder of a backside deposition apparatus. In this embodiment it is not necessary to have a seal upon which a perimeter of the substrate rests. Instead, a higher gas pressure from an inert gas or purge gas originating from the front side surface to an exhaust prevents any deposition gas from reaching the front side surface of the substrate. For example, inert gas flow can be directed to cross a perimeter of the substrate flowing generally towards the backside surface or in a generally downward direction. The gas pressure differential itself can create a seal between the substrate and the substrate support.

A given gas pressure differential can be based on particular film materials being deposited and/or type of deposition process. By way of a non-limiting example, if a pressure of the lower section is maintained at about 1 torr, then a pressure of the upper section can be maintained at about 1.5 torr. Preferably, a pressure differential is maintained sufficient to prevent migration of deposition gases to the front side surface of the substrate, but with the pressure differential not great enough to cause excessive deflection of the substrate.

In some embodiments there can be a single exhaust and other embodiments can have two or more exhausts. There is an exhaust for inert gas originating from an upper portion of the chamber (front side surface areas) crossing a front side surface of the substrate (first vacuum exhaust 174), and an exhaust for deposition gas from the backside surface of the substrate (second vacuum exhaust 134). The inert gas is inert in that it is selected to not interfere with the backside surface deposition reaction. Thus, the inert gas may not be inert in all chemistries, but will not disrupt the deposition if inert gas reaches the backside surface. Arrows in FIG. 2 illustrate air flow in the area of the substrate support mechanism.

Note that there is a small gap between the substrate and the substrate support. This can be due to the substrate merely resting on the support and having some gaps as the substrate is not perfectly flat. This can be a result of typical wafer bowing that results from various fabrication techniques. Accordingly, with spaces between the substrate and substrate support, there is sufficient space for deposition gas to pass through these gaps and travel to the top surface of the substrate. In this embodiment, however, across the perimeter of the substrate inert gas pressure is maintained at a greater pressure as compared to the deposition gas pressure. Maintaining a higher pressure of inert gas on the outside portion of the substrate support as compared to deposition gas pressure in the lower section 112 prevents deposition gas from passing through gaps between the substrate and substrate support.

In addition to the higher pressure, the inert gas can be directed towards an inert gas exhaust (first vacuum exhaust 174) which is located away from the front side surface. Thus, a flow of inert gas towards this exhaust can further prevent deposition gas from reaching a front side surface. With such a configuration, inert gas flow mostly flows to first vacuum exhaust 174, but having a higher pressure in the upper section 111 results in a portion of the inert gas flowing to second vacuum exhaust 134 through any gaps between the substrate and substrate support. Accordingly, in this embodiment, no seal is needed around the periphery of the substrate and this differential gas pressure and/or directional gas flow prevents any deposition gas from reaching a front side surface of the substrate. Any deposition gas that happens to pass through any gaps would then flow to first vacuum exhaust 174 without reaching the front side surface 106. In some embodiments, a single vacuum pump can be used for both the first vacuum exhaust 174 and the second vacuum exhaust 134. Exhaust conduits can be varied in size to create pressure drops to assist with flows of exhaust gases to a single vacuum pump.

Another embodiment includes an apparatus for depositing films on a backside of a substrate using a pressure differential to protect the front side surface of the substrate. In this embodiment, a processing chamber has an upper section and a lower section. A substrate support is positioned in the processing chamber and configured to hold a substrate between the upper section and the lower section. This support can be, for example, a rigid, annular support. The substrate has a front side surface for electrical devices and a backside surface opposite the front side surface. The substrate support is configured to support the substrate at a perimeter of the substrate without being in contact with interior regions of the front side surface and without being in contact with interior regions of the backside surface. The substrate support is configured to support the substrate with the front side surface facing the upper section and with the backside surface facing the lower section.

A first gas distribution unit is positioned in the lower section and faces the backside surface of the substrate when the substrate is being held by the substrate support mechanism. The first gas distribution unit is configured to direct deposition gas to the backside surface of the substrate for depositing a film on the backside surface of the substrate. This can include a showerhead assembly having a diameter similar to a diameter of the substrate, or the showerhead assembly can be substantially smaller and positioned near a center point of the substrate to flow deposition gas radially across the backside surface of the substrate.

A second gas distribution unit is configured to flow inert gas into the upper section of the processing chamber sufficient to create a greater gas pressure in the upper section as compared to the lower section. The second gas distribution unit can be embodied as a showerhead assembly or a centrally located conduit or peripherally located conduits, et cetera.

A controller is configured to control flow of the deposition gas from the first gas distribution unit for deposition on the backside surface of the substrate. The controller is also configured to control flow of the inert gas into the upper section to maintain a gas pressure differential sufficient to prevent passage of the deposition gas from the lower section to the front side surface of the substrate when the substrate is resting on the substrate support. The controller can be embodied as one or multiple controllers.

A first vacuum exhaust can be connected to the upper section and a second vacuum exhaust connected to the lower section. The controller can be configured to control the first vacuum exhaust and the second vacuum exhaust to create a pressure differential (or help created a pressure differential) between the upper section and the lower section when the substrate is being supported within the processing chamber. In other embodiments, the first vacuum exhaust is connected to the upper section and a second vacuum exhaust connected to the lower section wherein the first vacuum exhaust and the second vacuum exhaust are connected to a single vacuum pump.

Accordingly, a pressure differential and/or inert gas flows can be used to execute backside wafer deposition without depositing undesirable materials on a working surface of the substrate.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. An apparatus for depositing films on a backside of a substrate, the apparatus comprising:
   a processing chamber comprising a top wall, a bottom wall and a side wall extending from the top wall to the bottom wall to enclose the processing chamber, the processing chamber having an upper section and a lower section;
   a substrate support configured to hold a substrate between the upper section and the lower section, the substrate having a front side surface for electrical devices and a backside surface opposite the front side surface, the substrate support having an annular support surface configured to support the substrate along an entire perimeter of the substrate without being in contact with interior regions of the front side surface and without being in contact with interior regions of the backside surface, the substrate support configured to support the substrate with the front side surface facing the upper section and with the backside surface facing the lower section;
   a first showerhead positioned in the processing chamber and configured to flow process gas to the backside surface of the substrate;
   a second showerhead positioned in the processing chamber and oriented opposite the first showerhead and configured to flow control gas to the front side surface of the substrate, the substrate support configured to hold the substrate at a spaced apart relationship between the first showerhead and the second showerhead; and
   a plasma source for generating deposition gas; and
   a controller configured to control the plasma source and flow of the deposition gas from the first showerhead for deposition on the backside surface of the substrate, the controller configured to control flow of the control gas via the second showerhead to maintain a gas pressure differential between the upper section and lower section sufficient to prevent passage of the deposition gas from the lower section to the front side surface of the substrate when the substrate is resting on the substrate support.

2. The apparatus of claim 1, wherein the controller is configured to maintain a first gas pressure at the front side surface higher than a second gas pressure at the backside surface sufficient to prevent passage of the deposition gas from the backside surface of the substrate to the front side surface of the substrate when the substrate is resting on the substrate support.

3. The apparatus of claim 2, wherein the first showerhead comprises multiple openings arranged along the backside surface of the substrate when the substrate is resting on the substrate support.

4. The apparatus of claim 3, wherein the first showerhead comprises a plenum region provided on a first side of the multiple openings and a second side of the multiple openings is arranged along the backside surface of the substrate when the substrate is resting on the substrate support.

5. The apparatus of claim 3, wherein the multiple openings are evenly spaced along the backside surface of the substrate when the substrate is resting on the substrate support.

6. The apparatus of claim 3, further comprising a vacuum exhaust system configured to evacuate the processing chamber.

7. The apparatus of claim 6 wherein the controller is configured to control the vacuum exhaust system to maintain the first gas pressure at the front side surface and the second gas pressure at the backside surface when the substrate is resting on the substrate support.

8. The apparatus of claim 7, wherein the vacuum exhaust system comprises:
 a first vacuum exhaust connected to a first exhaust port coupled to the upper section of the processing chamber and configured to evacuate the processing chamber; and
 a second vacuum exhaust connected to a second exhaust port coupled to the lower section of the processing chamber and configured to evacuate the processing chamber, wherein the controller is configured to control the first and second vacuum exhausts to maintain the first gas pressure at the front side surface and the second gas pressure at the backside surface when the substrate is resting on the substrate support.

9. The apparatus of claim 2, further comprising a first heating mechanism configured to controllably heat the deposition gas.

10. The apparatus of claim 2, further comprising a second heating mechanism configured to controllably heat the front side surface of the substrate.

11. The apparatus of claim 2, wherein the substrate support is configured to vertically translate the substrate within the processing chamber.

12. The apparatus of claim 2, wherein the plasma source is a remote plasma source connected to the first gas distribution unit.

13. The apparatus of claim 2, wherein the controller is configured to maintain a first gas pressure at the front side surface higher than a second gas pressure at the backside surface sufficient to permit passage of the control gas from the front side surface to the backside surface when the substrate is resting on the substrate support.

14. An apparatus for depositing films on a backside of a substrate, the apparatus comprising:
 a processing chamber comprising a top wall, a bottom wall and a side wall extending from the top wall to the bottom wall to enclose the processing chamber;
 a substrate support configured to hold a substrate having a front side surface for electrical devices and a backside surface opposite the front side surface, the substrate support having an annular support surface configured to support the substrate along an entire perimeter of the substrate to form a continuous support interface between the annular support surface and a perimeter region of the backside surface such that substrate support, the support interface and the substrate separate a backside process environment of the substrate from a front side process environment of the substrate, the substrate support configured to support the substrate with the front side surface exposed to the front side process environment and with the backside surface exposed to the backside process environment;
 a first showerhead positioned in the backside process environment and configured to flow a deposition gas to the backside surface of the substrate;
 a second showerhead positioned in the front side process environment configured to flow a control gas to the front side surface of the substrate;
 a vacuum exhaust system configured to evacuate the processing chamber; and
 a controller configured to control at least one of the flow of the deposition gas from the first showerhead, the flow of the control gas from the second shower head, and the vacuum exhaust system to maintain the front side process environment at a first gas pressure which is higher than a second gas pressure at the backside process environment such that the deposition gas is impeded from flowing to the front side surface of the substrate when the substrate is resting on the substrate support.

15. The apparatus of claim 14, wherein the controller is configured to maintain the first gas pressure at the front side surface higher than a second gas pressure at the backside surface sufficient to permit passage of the control gas from the front side surface to the backside surface when the substrate is resting on the substrate support.

16. The apparatus of claim 14, wherein the first showerhead comprises:
 multiple openings arranged along the backside surface of the substrate when the substrate is resting on the substrate support; and
 a plenum region provided on a first side of the multiple openings and a second side of the multiple openings is arranged along the backside surface of the substrate when the substrate is resting on the substrate support.

17. The apparatus of claim 14, further comprising a first heating mechanism configured to controllably heat the deposition gas.

18. The apparatus of claim 14, wherein the substrate support is configured to vertically translate the substrate within the processing chamber.

19. The apparatus of claim 14, wherein the deposition gas is a plasma deposition gas.

20. The apparatus of claim 14, wherein the substrate support surface is suspended within the process chamber and supported by a structure which extends from a sidewall of the processing chamber.

* * * * *

UNITED STATES PATENT AND TRADEMARK OFFICE
CERTIFICATE OF CORRECTION

| | | |
|---|---|---|
| PATENT NO. | : 12,341,053 B2 | Page 1 of 1 |
| APPLICATION NO. | : 18/581154 | |
| DATED | : June 24, 2025 | |
| INVENTOR(S) | : Nasman et al. | |

It is certified that error appears in the above-identified patent and that said Letters Patent is hereby corrected as shown below:

In the Claims

In Column 12, Claim 14, Line 14, delete "environment" and insert -- environment and --, therefor.

In Column 12, Claim 14, Line 20, delete "shower head," and insert -- showerhead, --, therefor.

Signed and Sealed this
Eleventh Day of November, 2025

John A. Squires
*Director of the United States Patent and Trademark Office*